United States Patent
Chang et al.

(10) Patent No.: US 7,579,042 B2
(45) Date of Patent: Aug. 25, 2009

(54) METHODS FOR THE FABRICATION OF THERMALLY STABLE MAGNETIC TUNNEL JUNCTIONS

(75) Inventors: Y. Austin Chang, Middleton, WI (US); Jianhua J. Yang, Madison, WI (US); Peter F. Ladwig, Hutchinson, MN (US)

(73) Assignee: Wisconsin Alumni Research Foundation, Madison, WI (US)

( * ) Notice: Subject to any disclaimer, the term of this patent is extended or adjusted under 35 U.S.C. 154(b) by 289 days.

(21) Appl. No.: 10/902,281

(22) Filed: Jul. 29, 2004

(65) Prior Publication Data

US 2006/0021213 A1 Feb. 2, 2006

(51) Int. Cl.
*C23C 16/00* (2006.01)
*B05D 3/00* (2006.01)

(52) U.S. Cl. ............ 427/248.1; 427/250; 427/295; 427/127

(58) Field of Classification Search ............ None
See application file for complete search history.

(56) References Cited

U.S. PATENT DOCUMENTS

| | | | |
|---|---|---|---|
| 5,640,343 A | 6/1997 | Gallagher et al. | |
| 5,729,410 A | 3/1998 | Fontana, Jr. et al. | |
| 6,261,646 B1 | 7/2001 | Chen et al. | |
| 6,296,741 B1 | 10/2001 | Pinarbasi | |
| 6,333,103 B1 * | 12/2001 | Ishii et al. | 428/325 |
| 6,359,289 B1 | 3/2002 | Parkin | |
| 6,452,204 B1 | 9/2002 | Ishiwata et al. | |
| 6,655,006 B2 | 12/2003 | Pinarbasi | |
| 6,693,774 B2 | 2/2004 | Watanabe et al. | |
| 2003/0198754 A1 * | 10/2003 | Xi et al. | 427/576 |
| 2004/0145850 A1 * | 7/2004 | Fukumoto et al. | 361/143 |

OTHER PUBLICATIONS

Waits, Robert K. "Monitoring residual and process gases in PVD processes: The importance of sensitivity" Micromagazine.com Jun. 1997 http://www.micromagazine.com/archive/97/06/waits.html.*
Moller, W. et al. "Surface processes and diffusion mechanisms of ion nitriding of stainless steel and aluminum" Surface Coatings and Technology 136 (2001) 73-79.*
Moodera, et al., "Optimum tunnel barrier in ferromagnetic-insulator-ferromagnetic tunneling structures." Appl. Phys. Lett. 70 (22), pp. 3050-3052, 1997. Published by American Institute of Physics.

(Continued)

*Primary Examiner*—Frederick Parker
*Assistant Examiner*—Kelly M Stouffer
(74) *Attorney, Agent, or Firm*—Foley & Lardner LLP

(57) ABSTRACT

Magnetic tunnel junctions and method for making the magnetic tunnel junctions are provided. The magnetic tunnel junctions are characterized by a tunnel barrier oxide layer sandwiched between two ferromagnetic layers. The methods used to fabricate the magnetic tunnel junctions are capable of completely and selectively oxidizing a tunnel junction precursor material using an oxidizing gas containing a mixture of gases to provide a tunnel junction oxide without oxidizing the adjacent ferromagnetic materials. In some embodiments the gas mixture is a mixture of CO and $CO_2$ or a mixture of $H_2$ and $H_2O$.

28 Claims, 3 Drawing Sheets

OTHER PUBLICATIONS

Zhu, et al., "Determination of the thickness of Al oxide films used as barriers in magnetic tunneling junctions." *Applied Physics Letters*, 78 (20)., pp. 3103-3105, 2001. Published by the American Institute of Physics.

Kottler, et al., "An in situ x-ray photoelectron spectroscopy study of $AlO_x$ spin tunnel barrier formation." *Journal of Applied Physics*, 89 (6), pp. 3301-3306, 2001. Published by American Institute of Physics.

Sugahara, et al. Tunneling magnetoresistance in fully epitaxial MnAs/AlAs/MnAs ferromagnetic tunnel junctions grown on vicinal GaAs(111)B substrates. *Applied Physics Letters*, 80 (11) pp. 1969-1971, 2002. Published by American Institute of Physics.

Ladwig, et al. Fabrication of Thermodynamically Stable Oxide Layers for Use in Tunneling Magnetoresistive (TMR) Readers. A proposal submitted to Seagate Technology on Jul. 30, 2002.

Ladwig, et al. Fabrication of Thermodynamically Stable Oxide Layers for Use in Tunneling Magnetoresistive (TMR) Readers. A proposal submitted to Seagate Technology on Sep. 30, 2002.

Yang. "Fabrication of Thermodynamically Stable Oxide Layers for Use in Tunneling Magnetoresistive (TMR) Readers." Written report for Research Readiness Exam presented by Jianhua Yang to his research committee on Aug. 28, 2003.

Boubeta, et al., "Epitaxy, magnetic and tunnel properties of transition metal/MgO(001) heterostructures." *Journal of Physics: Condensed Matter* 15, pp. R1123-R1167, 2003. Published by Institute of Physics Publishing.

Mitani, et al. "Fe/MgO/FeCo(100) epitaxial magnetic tunnel junctions prepared by using in situ plasma oxidation." *Journal of Applied Physics*, 93 (10), pp. 8041-8043, 2003. Published by American Institute of Physics.

Chang. "Fabrication of Thermodynamically Stable Oxide Layers for Use in Tunneling Magnetoresistive Readers." Power Point slides from oral presentation at Seagate Techology, Oct. 6, 2003.

Shen, et al., "Observation of the barrier structure in magnetic tunnel junctions using high-resolution electron microscopy and electron holography." *Applied Physics Letters*, 83 (26), pp. 5482-5484, 2003. Published by American Institute of Physics.

Yu, et al., "Electron transport properties in magnetic tunnel junctions with epitaxial NiFe (111) ferromagnetic bottom electrodes." *Applied Physics Letters*, 82 (26) pp. 4735-4737, 2003. Published by American Institute of Physics.

Pages 148-167; 187-188; 247-258 and 264-271 of Peter Ladwig's thesis presented on Jul. 30, 2003 and cataloged Feb. 6, 2004.

Oleynik, et al. "Metal-oxide interfaces in magnetic tunnel junctions." *Interface Science*, 12, pp. 105-116, 2004. Published by Kluwer Academic Publishers.

Banach, et al. Delocalization and charge disproportionation in $La_{(1-x)}Sr_xMnO_3$, *Physical Review B*, 69, p. 054427-1, 2004. Published by The American Physical Society.

Lacour, et al., "On the use of exchange biased top electrodes in magnetic tunnel junctions." *Journal of Magnetism and Magnetic Materials*, 270, pp. 403-406, 2004. Published by Elsevier.

A research progress report on $H_2O/H_2$ gas mixture. Power Point slides presented in oral presentation to Seagate Technology on Feb. 6, 2004.

Chang "Fabrication of Thermodynamically Stable Oxide Layers for Use in Tunneling Magnetoresistive Readers." Power Point slides from oral presentation at Seagate Technology, Oct. 6, 2003.

"A research progress report on $H_2O/H_2$ gas mixture." Power Point slides presented in oral presentation to Seagate Technology on Feb. 6, 2004.

* cited by examiner

METHODS FOR THE FABRICATION OF THERMALLY STABLE MAGNETIC TUNNEL JUNCTIONS

STATEMENT OF GOVERNMENT RIGHTS

Research funding was provided for this invention by the United States Department of Energy under grant No. DE-FG02-99ER45777. The United States government has certain rights in this invention.

FIELD OF THE INVENTION

The present invention relates generally to magnetic tunnel junctions and to methods for fabricating the same.

BACKGROUND

The demand for increasing areal density in the magnetic storage industry drives the search for new magnetoresistive readers with increased sensitivity. The tunneling magnetoresistive (TMR) read head is one device that has been investigated recently as a highly sensitive magnetoresistive reader. A TMR utilizes a magnetic tunnel junction (MTJ) composed of a tunnel barrier layer made from a non-magnetic insulating material sandwiched between two ferromagnetic layers. The insulating layer is thin enough to permit quantum-mechanical tunneling of charge carriers between the ferromagnetic layers. The tunneling is electron spin-dependent and, therefore, the tunneling current depends on the spin-dependent electronic properties of the ferromagnetic materials and the relative orientations of the magnetization directions of the ferromagnetic layers. For this reason, the two ferromagnetic layers are designed to have different responses to magnetic fields so that the orientation of their magnetic moments may be varied by an external magnetic field. One of the ferromagnetic layers in the MTJ, called the pinned layer, is composed of a material whose magnetic moment does not rotate in response to an applied magnetic field in the device's range of interest. In some MTJs the ferromagnetic layer is pinned by being exchange coupled to an antiferromagnetic layer. The other ferromagnetic layer is a free layer, that is, its magnetic moment is free to respond to an applied magnetic field in the device's range of interest.

Some MTJs include a tunnel barrier layer doped with magnetic particles. This doping provides an increase in magnetoresistance and an improved signal to noise ratio. For example, some MTJs have an aluminum oxide tunnel barrier layer doped with magnetic particles such as cobalt, iron or nickel particles.

The success of the tunneling in an MTJ will depend on the quality of the insulting tunnel barrier layer in the device. A high quality tunnel barrier layer is desirably made from a uniform, stoichiometric oxide composition sandwiched between two completely unoxidized ferromagnetic layers. Unfortunately the production of such high quality tunnel barrier layers has proven to present a significant challenge because it is difficult to completely oxidize the tunnel barrier layer in the MTJ without at least partially oxidizing the neighboring ferromagnetic layers and any magnetic particles used to dope the tunnel barrier layer. In one common fabrication scheme a pure metal is deposited on a ferromagnetic layer and subsequently oxidized in air or in an oxygen gas or plasma. Using this method, the oxidation progress must be precisely monitored in order to avoid over- or under-oxidizing the tunnel barrier layer. In addition, this approach may result in an oxygen concentration gradient across the tunnel barrier layer and the underlying ferromagnetic layer. Such an oxygen concentration gradient may be difficult to eliminate once formed. Another method presently used to produce MTJs is reactive sputtering from a metal target in an oxygen gas atmosphere to deposit a metal oxide onto a ferromagnetic layer. Unfortunately this approach exposes the underlying ferromagnetic layer to an oxygen rich plasma, causing at least a portion of the ferromagnetic material to become oxidized. Sputtering from an oxide target is another technique used to deposit a metal oxide layer on a ferromagnetic layer. However, this approach typically provides low yield and poor reproducibility and is characterized by an inability to consistently form thin, uniform, pinhole-free layers of metal oxide.

In the production of a MTJ it is important to use an insulating tunnel barrier layer that is neither over-nor under-oxidized, as both conditions will affect the performance of the device. The effects of over- or under-oxidation of the tunnel barrier layer may be illustrated using a MTJ with an aluminum oxide tunnel barrier layer as an example. If the pure aluminum (Al) layer is under-oxidized, the unoxidized Al adjacent the neighboring ferromagnetic layer will significantly influence the behavior of tunneling in the device. Specifically, at the ferromagnetic/aluminum interface, the ferromagnetic material may induce spin polarization of the Al layer to an extent that is lower than the polarization of the ferromagnetic material. Thus, the tunneling current coming from the underlying ferromagnetic layer in contact with the Al metal will be only weakly polarized, thereby decreasing the junction magnetoresistance. In addition, the pure Al present in the tunnel barrier layer may react with the underlying ferromagnetic materials (e.g., Co and Fe) to form intermetallic compounds and degrade the performance of the junction. On the other hand, if the tunnel barrier layer is over-oxidized there is a possibility that the oxidation will continue into the underlying ferromagnetic surface. The formation of an oxide of the ferromagnetic material gives rise to spin scattering and an increase in the junction resistance, resulting in a decrease in the junction magnetoresistance.

Thus a need exists for a method of selectively and completely oxidizing the tunnel barrier layer in an MTJ without oxidizing the neighboring ferromagnetic layers to provide a thermodynamically stable MTJ.

SUMMARY OF THE INVENTION

Magnetic tunnel junctions and methods for making the magnetic tunnel junctions are provided. The magnetic tunnel junctions are characterized by a tunnel barrier oxide layer sandwiched between two ferromagnetic layers. The methods used to fabricate the magnetic tunnel junctions are capable of completely and selectively oxidizing a tunnel junction precursor material to provide a tunnel junction oxide without oxidizing the adjacent ferromagnetic materials.

The present methods include the steps of depositing a tunnel barrier precursor material onto an underlying ferromagnetic substrate and exposing the tunnel barrier precursor material to an oxidizing gas having a low oxygen partial pressure in order to provide for the controlled and selective oxidation of the tunnel barrier precursor material under conditions wherein the formation of the tunnel barrier oxide is thermodynamically stable and the formation of oxides of the ferromagnetic materials is not. In some instances the partial pressure of oxygen used to oxidize the precursor materials may be $10^{-50}$ Torr or even lower. Such low oxygen partial pressures are difficult to achieve using air or $O_2$ as an oxidizing gas. However, such low oxygen partial pressures may be readily achieved and carefully controlled in the present methods by controlling the ratio of partial pressures of a first gas and a second gas in an oxidizing gas composed of a mixture of the two gases. Examples of gas mixtures that may be used to achieve sufficiently low oxygen partial pressures include a mixture of carbon monoxide (CO) (i.e., the first gas) and carbon dioxide ($CO_2$) (i.e., the second gas) or a mixture of hydrogen gas ($H_2$) (i.e., the first gas) and water ($H_2O$) (i.e., the second gas). In order to speed up the kinetics of oxidation, the oxidation may be carried out at elevated temperatures and pressures.

The tunnel barrier precursor material may be a metal or a semiconductor. Aluminum is well suited as a metal tunnel barrier precursor because aluminum oxides (e.g. $Al_2O_3$) provide well-known tested tunnel barrier oxides in MTJs. Examples of suitable ferromagnetic layers for use in the MTJs include alloys of cobalt and iron and alloys of nickel and iron.

The MTJs provided herein are well suited for use in a variety of magnetic sensor and storage devices, including magnetoresistive read heads and nonvolatile random access memory.

Further objects, features and advantages of the invention will be apparent from the following detailed description when taken in conjunction with the accompanying drawings.

DETAILED DESCRIPTION OF THE INVENTION

Methods for making an MTJ with a uniform oxide tunnel barrier layer sandwiched between two non-oxidized ferromagnetic layers are provided. The methods provided herein are based on the complete, selective, thermodynamically controlled oxidation of a metal or semiconductor layer deposited over a ferromagnetic layer. These methods take advantage of the ability to carefully control the $O_2$ partial pressure ($pO_2$) in an oxidizing gas by employing an oxidizing gas containing a mixture of a first gas and a second gas, wherein the ratio of the partial pressure of the first gas to the partial pressure of the second gas may be adjusted to provide a desired oxygen partial pressure in the oxidizing gas. For example, the oxidizing gas mixture may contain a mixture of CO and $CO_2$ or a mixture of $H_2$ and $H_2O$.

Figure 1:
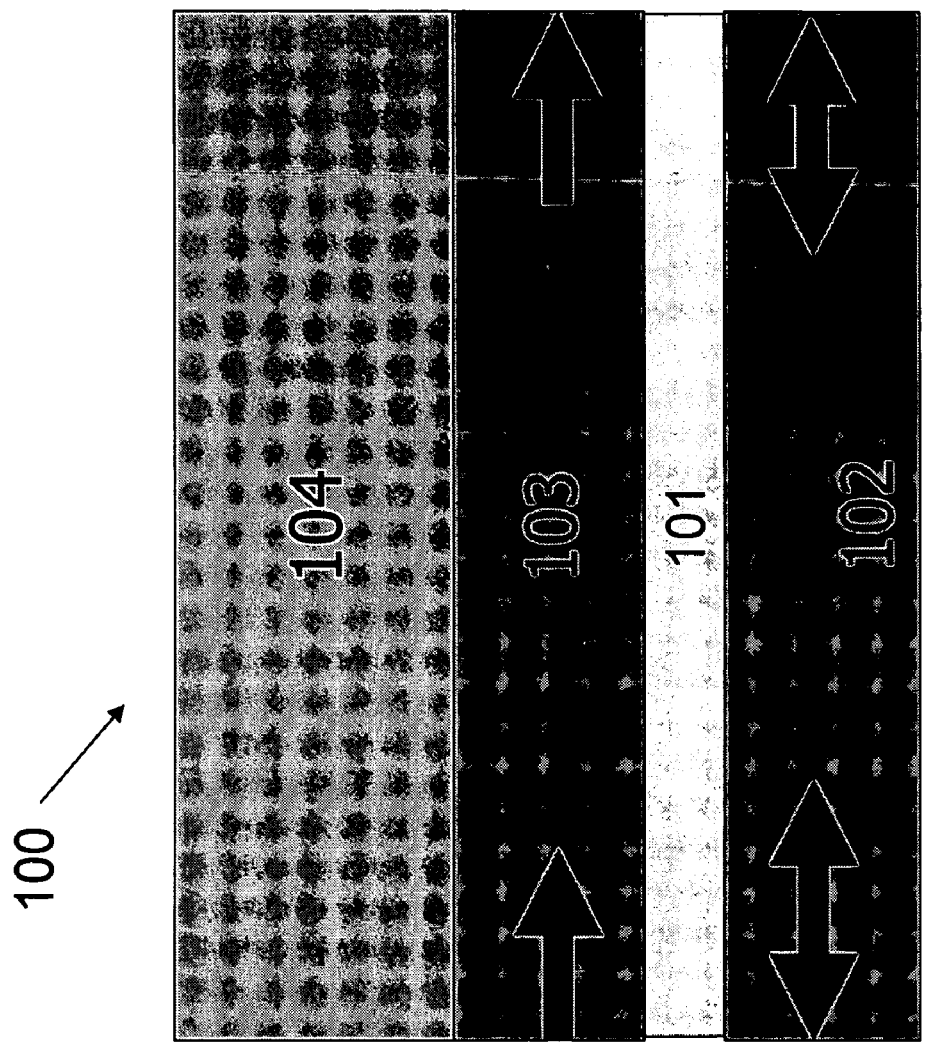
FIG. 1 is a schematic cross-sectional diagram of a magnetic tunnel junction in accordance with the present invention.

As shown in FIG. 1, an MTJ 100 produced in accordance with the present methods generally includes an oxide tunnel barrier layer 101 sandwiched between a free ferromagnetic layer 102 and a pinned ferromagnetic layer 103. Typically, the pinned ferromagnetic layer is pinned by exchange coupling to an adjacent antiferromagnetic pinning layer 104. The oxide tunnel barrier layer 101 of the MTJ optionally may be doped with magnetic particles (not shown).

The tunnel barrier layers 101 in the MTJs in accordance with the invention are composed of high quality oxide layers desirably characterized by a uniform concentration of oxygen throughout the tunnel barrier layer. The materials selected to provide the tunnel barrier oxides are desirably characterized as being good oxide formers, (e.g. metal oxides or semiconductor oxides having large negative enthalpies of formation). The selected materials are also desirably characterized by low band gaps, and therefore low junction resistances, which lead to improved sensitivity of the MTJs into which they are incorporated. For the purposes of this disclosure the materials (i.e. metals or semiconductors) that are oxidized to provide tunnel barrier oxides are referred to as "tunnel oxide precursors." Suitable metals for use in the production of metal oxide tunnel barrier layers in accordance with the present methods include transition metals, rare earth metals (lanthanides), actinides, alkali metals and alkaline earth metals. Specific examples of metal and semiconductor materials that may be oxidized to produce the oxide tunnel barrier layers include, but are not limited to, aluminum (Al), yttrium (Y), tantalum (Ta), hafnium (Hf), zirconium (Zr), gallium (Ga), chromium (Cr), manganese (Mn), silicon (Si), titanium (Ti), magnesium (Mg), niobium (Nb) and calcium (Ca), and alloys thereof. Aluminum oxide ($Al_2O_3$) is perhaps the best known material for use as a tunnel barrier layer in MTJs and is particularly well-suited as a tunnel barrier layer in accordance with the present methods.

The tunnel barrier layers will generally be quite thin in order to provide low RA (i.e., resistance×area). Typically, the tunnel barrier layers will have a thickness of no more than about 10 nanometers (nm). This includes tunnel barrier layers having a thickness of no more than about 2 nm, further includes tunnel barrier layers having a thickness of no more than about 1 nm and still further includes tunnel barrier layers having a thickness of no more than about 5 angstroms (Å).

The ferromagnetic materials used to provide the free and pinned ferromagnetic layers and, optionally, dopant particles in the tunnel barrier layer in the MTJs may be selected to provide a thermodynamically stable interface between the ferromagnetic layers and tunnel barrier layer in order to minimize or eliminate reactions between the ferromagnetic material and the tunnel barrier oxides. As discussed in greater detail below, this generally means that the materials should be selected such that the free energy for the production of the oxides in the tunnel barrier layer is less than the free energy for production of oxides of the ferromagnetic materials. The pinned and free ferromagnetic layers may be made of the same or of different ferromagnetic materials. Suitable ferromagnetic materials for use as the ferromagnetic layers in the MTJs provided herein include iron (Fe), cobalt (Co), nickel (Ni), and their alloys. Specific examples of suitable metal alloys for use as ferromagnetic materials include, but are not limited to, Co—Fe alloys (e.g., $Co_{0.9}Fe_{0.1}$, or $Cu_{0.5}Fe_{0.5}$, and more generally $Co_xFe_{1-x}$) and Ni—Fe alloys (e.g. $Ni_{0.8}Fe_{0.2}$ and more generally $Ni_xFe_{1-x}$). For the purposes of this disclosure, Co—Fe alloys will be denoted by "CoFe" and Ni—Fe alloys will be denoted by "NiFe." Like the tunnel barrier layers, the ferromagnetic layers are typically quite thin. For example, in some MTJs the thickness of the ferromagnetic layers may be no more than about 10 nanometers. This includes embodiments where the ferromagnetic layers each have a thickness of no more than about 2 nanometers and further includes embodiments with a ferromagnetic layers each have a thickness of about 1 nanometer.

The antiferromagnetic layer, which serves as a pinning layer in the MTJs provided herein, may be selected from a variety of known antiferromagnetic materials that have conventionally been used for this purpose. Such antiferromagnetic materials include, but are not limited to, Ni—Mn alloys, Fe—Mn alloys and Pt—Mn alloys. In addition to the antiferromagnetic layer, the pinned layer, the tunnel barrier layer and the free layer, the MTJs may optionally include other layers, such as a support substrate and/or various insulating or conducting layers.

Figure 2:
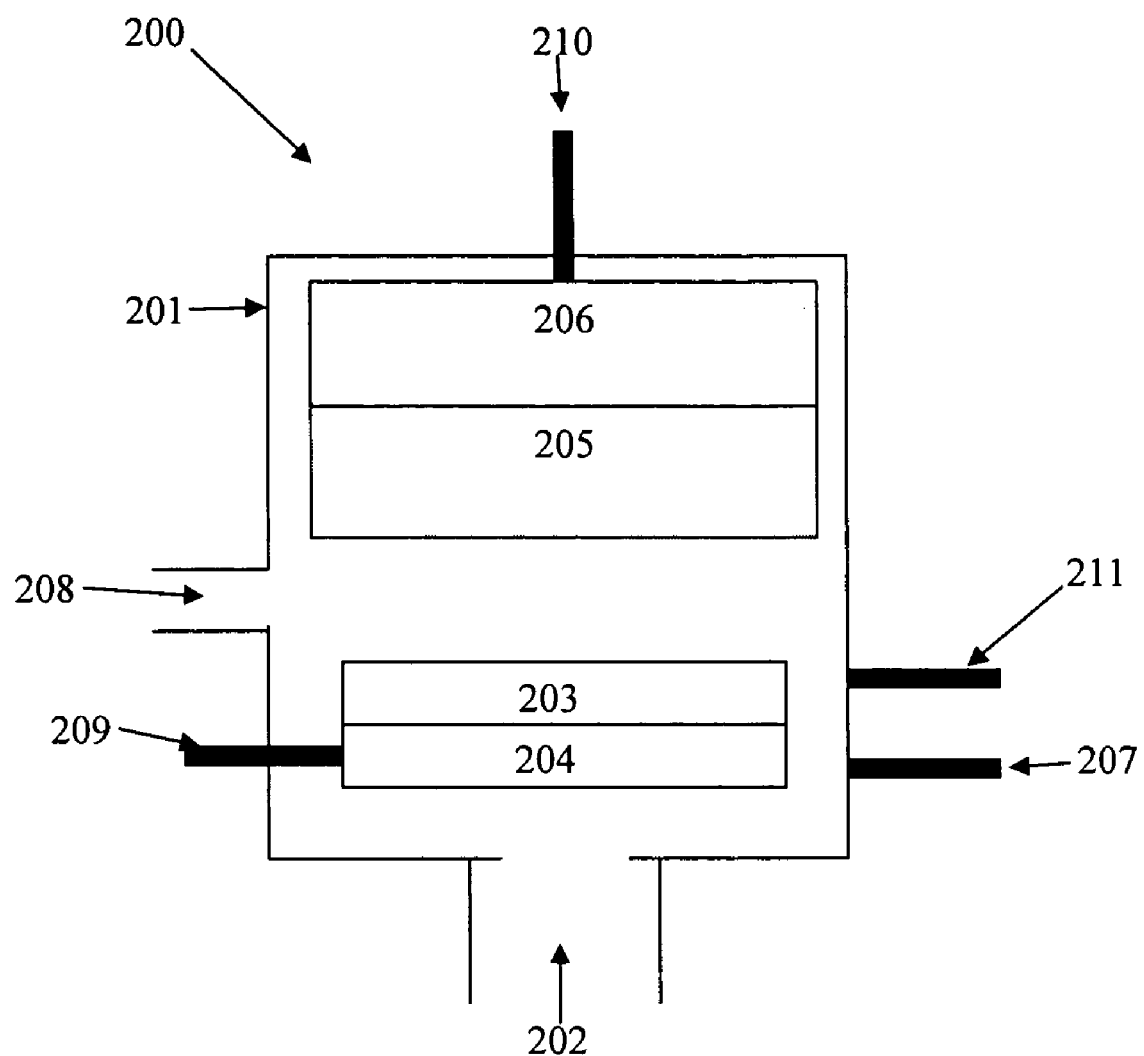
FIG. 2 is a schematic cross-sectional diagram of an apparatus that may be used to fabricate a magnetic tunnel junction in accordance with the present invention.

The ferromagnetic materials and the metal or semiconductor materials may be deposited over their respective underlying layers or substrates using a variety of deposition techniques, many of which are well known. Such techniques include, but are not limited to, sputter deposition and evaporative deposition. FIG. 2 is a schematic diagram of an apparatus that may be used to deposit the various layers in the MTJ. The apparatus 200 includes an ultrahigh vacuum chamber 201 in fluid communication through a vacuum port 202 with one or more vacuum pumps (not shown). The vacuum chamber 201 houses a substrate 203 on which the various layers of the MTJ will be grown. The substrate 203 may be mounted over a heater 204 connected to a power source 209. A target material 205 (e.g., a tunnel barrier precursor target or a ferromagtic target) is disposed over the substrate 203. The target material is in electrical contact with a thin film deposition source 206. As shown in FIG. 2, the deposition source 206 may be a DC magnetron sputtering source connected to a power input 210 and adapted to apply a negative potential to the target material 205. A plasma precursor gas, such as argon, is introduced into the chamber 201 through a plasma precursor gas inlet port 211 and a sputter plasma is ignited in the chamber. After a tunnel barrier precursor thin film has been deposited, an oxidizing gas is introduced into the chamber 201 through an oxidizing gas inlet port 207. The pressure in the chamber may be monitored using an appropriate pressure gauge mounted to a gauge mount 208. Other suitable methods and apparatus for depositing metal and ferromagnetic thin films are described in Kottler et al., *J. App. Phys.*, 89, 3301-3306 (2001) and Moordera et al., *Appl. Phys. Lett.*, 70, 3050-3052 (1997), the entire disclosures of which are incorporated herein by reference.

In one basic embodiment of the methods provided herein, a MTJ is made by depositing a layer of metal or semiconductor over an underlying ferromagnetic layer. The metal or semiconductor layer is then exposed to an oxidizing gas containing $O_2$ and at least two additional gases under oxidizing conditions that promote the formation of a tunnel barrier oxide but not the formation of oxides of the ferromagnetic elements. The at least two additional gases are characterized in that their ratio in the oxidizing gas mixture may be used to control the level of $O_2$ present in the oxidizing gas. Oxidizing gas mixtures containing CO and $CO_2$ or $H_2$ and $H_2O$ are examples of suitable oxidizing gas mixtures. By controlling the ratio of pCO to $pCO_2$ or the ratio of $pH_2$ to $pH_2O$ in the oxidizing gas, it is possible to selectively and completely oxidize the metal layer without oxidizing the adjacent ferromagnetic layers. After oxidation is complete, a second ferromagnetic layer is formed over the tunnel barrier oxide layer.

The conditions under which the metal or semiconductor material is oxidized to provide the tunnel barrier oxide layer should be selected such that the layer is selectively and completely oxidized while minimizing the oxidation of the adjacent ferromagnetic layer. In preferred embodiments, the conditions are selected to completely avoid any oxidation of the adjacent ferromagnetic material. Generally, this will involve the use of a very low $O_2$ partial pressure in the oxidizing gas. Specifically, the $O_2$ partial pressure is desirably low enough that oxidation of the metal or semiconductor layer is thermodynamically favored while oxidation of the ferromagnetic layer is not. As one of skill in the art would understand, the maximum desirable $O_2$ partial pressure in the oxidizing gas will depend both on the nature of the ferromagnetic material and the tunnel barrier material and on the oxidation temperature. However, in some instances the methods provided herein carry out the oxidation to form the tunnel barrier oxide at $O_2$ partial pressures of no more than about $1 \times 10^{-20}$ atmospheres (atm). This includes embodiments where the oxidation takes place using $O_2$ partial pressures of no more than about $1 \times 10^{-30}$ atm, further includes embodiments where the oxidation takes place using $O_2$ partial pressures of no more than about $10^{-40}$ atm, further includes embodiments where the oxidation takes place using $O_2$ partial pressures of no more than about $10^{-50}$ atm, further includes embodiments where the oxidation takes place using $O_2$ partial pressures of no more than about $10^{-60}$ atm, further includes embodiments where the oxidation takes place using $O_2$ partial pressures of no more than about $10^{-70}$, further includes embodiments where the oxidation takes place using $O_2$ partial pressures of no more than about $10^{-80}$ atm, and still further includes embodiments where the oxidation takes place using $O_2$ partial pressures of no more than about $10^{-100}$ atm.

These very low partial pressures of oxygen may not be practically achieved and controlled using air or pure $O_2$ as an oxidation gas. Instead, conventional approaches using such gases rely on kinetic control of the oxidation process under considerably higher $O_2$ partial pressures. These approaches have met with limited success, typically resulting in significant oxidation of adjacent ferromagnetic layers. In contrast, the inventors have discovered that such low $O_2$ partial pressures may be readily achieved and controlled using an oxidizing gas containing at least two gases in addition to $O_2$ wherein the level of $O_2$ in the mixture depends on the equilibrium between the at least two gases. In such systems, the ratio of the at least two other two gases present in the mixture may be used to adjust and control the level of $O_2$ present in the oxidizing gas. This relationship may be expressed using the equilibrium equation for the gases in the mixture. For example, an equilibrium reaction for a mixture containing $O_2$, a first gas ("A") and a second gas ("B"), may be expressed as: $nA+mO_2=qB$, where n, m and q represent the appropriate coefficients in the balanced equation. The equilibrium expression for the reaction is: $K=pB^q/(pA^n \times pO_2^m)$, where K is a constant at a given temperature. Thus, the relationship between $pO_2$ and the ratio pB:pA is: $P^{O2}=(pB^q/(K \times pA^n))^{1/m}$. Thus, by way of illustraton, an oxidizing gas containing a mixture of CO and $CO_2$ may be represented by the equilibrium reaction $2CO+O_2=2CO_2$, where the partial pressure of $O_2$ in the mixture may be adjusted according to the equation: $PO_2=pCO_2^2/(K \times pCO^2)$. Alternatively, an oxidizing gas containing a mixture of $H_2$ and $H_2O$ may be represented by the equilibrium reaction $2H_2+O_2=2H_2O$, where the partial pressure of $O_2$ in the mixture may be adjusted according to the equation: $PO_2=pH_2O^2/(K \times H_2^2)$.

The oxidation of the metals or semiconductors to provide oxide tunnel barrier layers is desirably carried out at elevated oxidation temperatures, elevated oxidation pressures or a combination of elevated oxidation temperatures and pressures. Elevated temperatures may be used to speed up the oxidation kinetics. Although the oxidation of the tunnel barrier layer may be carried out at room temperature (e.g. about 20 to 25° C.), in many instances it may be desirable to use elevated oxidation temperatures in order to reduce the necessary oxidation time. For example, in some embodiments of the methods provided herein, oxidation may be carried out at a temperature of at least about 50° C. This includes embodiments where the oxidation is carried out at a temperature of at least about 100° C., also includes embodiments where the oxidation is carried out at a temperature of at least about 200° C., further includes embodiments where oxidation is carried out at a temperature of at least 300° C., even further includes embodiments where the oxidation is carried out at a temperature of at least 400° C., and still further includes embodiments where the oxidation is carried out at a temperature of at least about 500° C. Generally, the oxidation temperature should be selected such that it is low enough to avoid the onset of reactions and interdiffusions between the elements in the tunnel barrier layer and the ferromagnetic material in the ferromagnetic layers. Thus, for example, if the ferromagnetic layers are made from a Co-containing material (e.g. CoFe), and Al is used as the metal in the tunnel barrier layer, the oxidation temperature is desirably no more than about 500° C. in order to avoid reactions and/or interdiffusion between Al atoms in the tunnel barrier layer and Co atoms in the ferromagnetic layer.

Elevated oxidation gas pressures may also be used to speed up the oxidation kinetics. For example, in some embodiments of the methods provided herein, the total pressure of the oxidizing gas (e.g. the total pressure of CO, $CO_2$ and $O_2$ or the total pressure of $H_2$, $H_2O$ and $O_2$) to which the metal or semiconductor layer is exposed will be at least about 100 Torr. This includes embodiments where the total pressure of the oxidizing gas is at least about 200 Torr, further includes embodiments where the total pressure of the oxidizing gas is at least about 300 Torr, still further includes embodiments where the total pressure of the oxidizing gas is at least about 400 Torr and even further includes embodiments where the total pressure of the oxidizing gas is at least about 500 Torr. In order to minimize the time required for the complete oxidation of the tunnel barrier layer, it may be desirable to use a combination of elevated temperatures and pressures.

The time required for the complete oxidation of the tunnel barrier layer in the MTJ will depend, at least in part, on the oxidation temperature and pressure and on the nature and thickness of the metal or semiconductor layer. However, in some embodiments of the methods provided herein, a completely oxidized tunnel barrier layer may be produced from a metal or semiconductor layer in no more than about eight hours. This includes embodiments where the tunnel barrier layer is completely oxidized in less than about five hours, further includes embodiments where the tunnel barrier layer is completely oxidized in less than about three hours, still further includes embodiments where the tunnel barrier layer is completely oxidized in less than about an hour and even further includes embodiments where the tunnel barrier layer is oxidized in less than about thirty minutes.

The MTJs provided in accordance with the present methods are well-suited for use in a variety of devices, including magnetic sensor and storage devices. For example, the MTJs may be used as magnetic field sensors (e.g. magnetoresistive read heads) for sensing the magnetic field signals from a rotating magnetic disk in a magnetic disk drive of a computer, as described in U.S. Pat. No. 5,729,410, the entire disclosure of which is incorporated herein by reference. The MTJs are also well suited for use as a memory cell in a nonvolatile magnetic random access memory (MRAM) array, as described in U.S. Pat. No. 5,640,343, the entire disclosure of which is incorporated herein by reference. A typical MRAM made from the MTJs provided herein includes an array of individual magnetic memory cells, each comprising an MTJ and a diode electrically connected in series.

Figure 3:
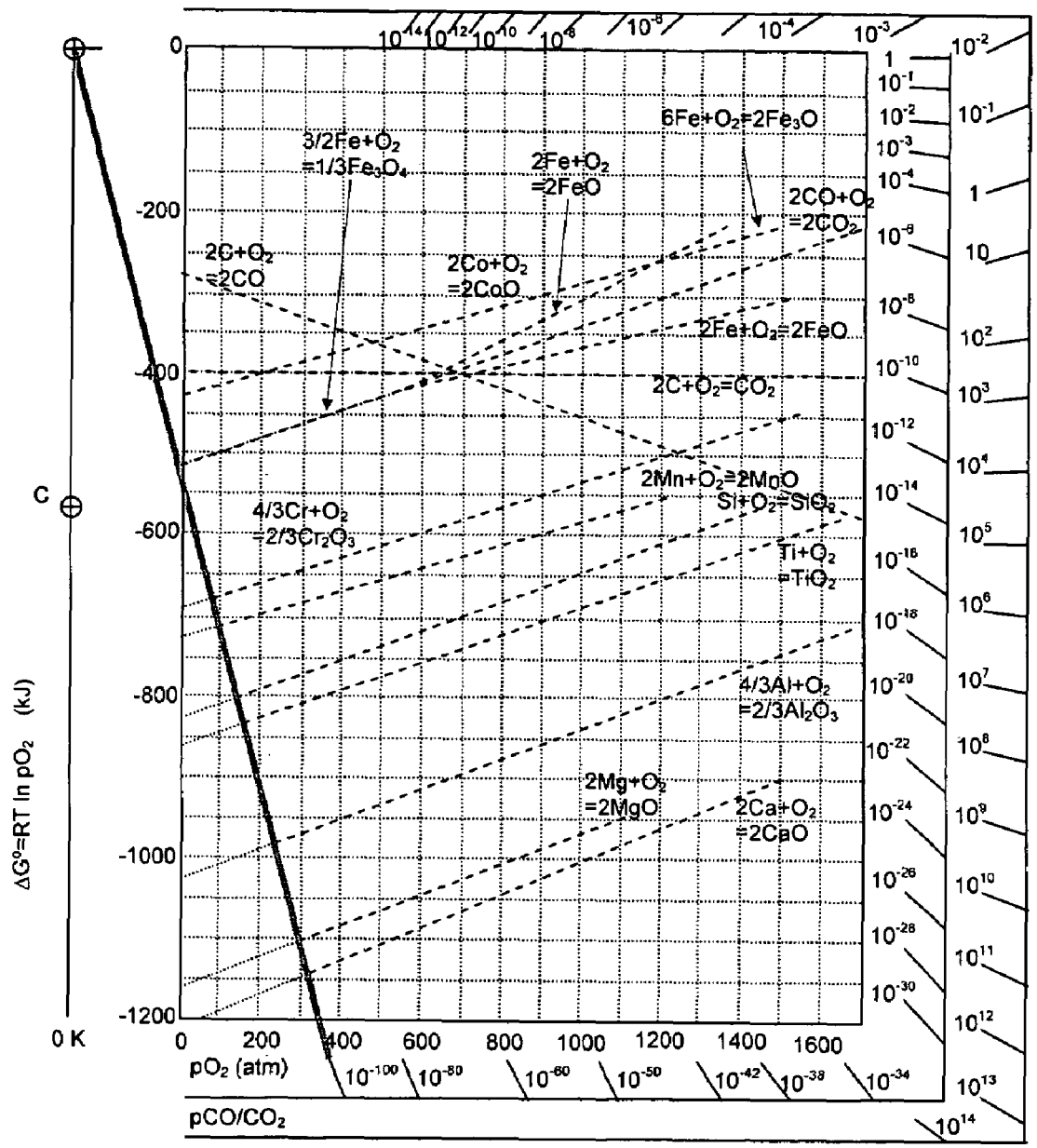
FIG. 3 is an Ellingham diagram for various metal oxides.

The following is a description of a method for calculating a desirable $pO_2$ for the production of an MTJ composed of an $Al_2O_3$ tunnel barrier layer disposed between two CoFe ferromagnetic layers. These calculations, and those that follow, are based on an exemplary MTJ having a $Co_{0.9}Fe_{0.1}$ alloy as the ferromagnetic layer. These calculations are based on the Ellingham diagram shown in FIG. 3. The Ellingham diagram is a type of phase diagram that plots the oxidation potential of several metal-metal oxide systems vs. temperature. Note that the slopes of all of the metal reactions in the diagram of FIG. 3 are positive and are of roughly the same magnitude. The slope is related to the entropy change ($\Delta S$) in the Gibbs free energy equation:

$$\Delta G = \Delta H - T\Delta S.$$

The metal-metal oxide reactions involve the incarceration of a high entropy gaseous species, $O_2$, in a lower entropy solid phase (note the negative sign in the equation which makes the slopes positive). Therefore, as temperature increases and the entropy contribution becomes larger, the oxidation reactions generally become less stable and require a higher $O_2$ partial pressure for stability.

The driving force for oxidation can be roughly calculated from the Ellingham diagram in the following manor. Lines of constant $O_2$ partial pressure are drawn diagonally from the origin to the desired position on the $O_2$ axis. For example, the grey line in FIG. 3 represents an $O_2$ partial pressure of $10^{-100}$ atm. At this partial pressure (for the oxidation reactions of interest), the dotted lines indicate regions where the oxidation reaction is stable, while the dashed lines indicate regions were the reduction of the oxide to pure metal is stable. At any given temperature, the length of a vertical line drawn from the grey line to the desired reaction yields the driving force for the oxidation/reduction reactions. Therefore, at an $O_2$ partial pressure of $10^{-100}$ atm and a temperature of 50° C. (based on the Ellingham diagram an $O_2$ partial pressure of $10^{-80}$ atm could also be used at 50° C.), there is a significant driving force to oxidize Cr, Mn, Si, Al, Mg and Ca, while Co, Fe and Ni will not oxidize.

In practical applications, an $O_2$ partial pressure of $10^{-100}$ atm is not attainable by introducing a known amount of $O_2$ into a high purity carrier gas such as argon (Ar). However, the $O_2$ partial pressure may be readily controlled by introducing an oxidizing gas having a known ratio of $pCO:pCO_2$.

Once a desirable $O_2$ partial pressure has been calculated or estimated, an appropriate $pCO:pCO_2$ ratio for the production of a MTJ, may be determined. Here again, we use an exemplary CoFe/$Al_2O_3$/CoFe MTJ as an illustration. As noted above, to avoid oxidizing Co at 298 K, the partial pressure of $O_2$ will have to be very low. For this illustration an $O_2$ partial pressure lower than $10^{-80}$ atm is used. This is extremely difficult to obtain even with high purity process gases. However, by using an appropriate $pCO:pCO_2$ ratio, this partial pressure of $O_2$ is attainable. An appropriate $pCO:pCO_2$ ratio may be calculated based on the thermodynamics of the equilibrium reaction $2CO + O_2 = 2CO_2$ (Reaction I), and the energies of formation ($\Delta G°_f$) from pure elements at 298 K of $O_2$, $CO_2$ and CO (i.e. $\Delta G°_{f,O2}=0$ (by definition); $\Delta G°_{f,CO2}=-3.946$ E5 J/mol; and $\Delta G°_{f,Co}=-1.379$ E5 J/mol, where "E" indicates that the number that follows represents an exponent, i.e. "E5"="$\times 10^5$"). The equilibrium equation for Reaction I is:

$$\Delta G°_{rxn\,I} = 2\,\Delta G°_{f,CO2} - \Delta G°_{f,O2} - 2\,\Delta G°_{f,CO2};\text{ also}$$

$\Delta G°_{rxnI} = -RT\ \ln(K) = -5.134$ E5 J/mol, where R is the gas constant, T is temperature and K is the equilibrium constant which equals:

$$K = \exp\left(\frac{-\Delta G°_{rxn}}{R \cdot T}\right) = \left(\frac{p_{CO2}^2}{p_{CO}^2 \cdot p_{O2}}\right) = 8.937\ E89,$$

wherein p represents a partial pressure. With this expression for K in terms of p, the required $pCO:pCO_2$ ratio needed to maintain any desired $O_2$ partial pressure may be determined.

Therefore, for a $pO_2=10^{-80}$ atm, the $pCO:pCO_2$ needed to provide this partial pressure is:

$$\frac{p_{CO}}{p_{CO2}} = (1/(p_{O2} \cdot K))^{1/2} = 1.1 \; E\text{-}5 \text{ or higher.}$$

Thus, the calculations indicate that in order to avoid oxidation of Co using a $PO_2$ of $10^{-80}$ atm at 50° C., the $pCO:pCO_2$ ratio needs to be greater than $1.1 \times 1\,0^{-5}$. This is easily attainable using commercially available process gases.

It should be noted, however, that because the Ellingham diagram is based on pure elemental oxidation it provides only a guide for estimating the minimum desirable $pCO:pCO_2$ ratio in the oxidizing gas. For ferromagnetic layers composed of alloys, this estimate may be too low and the user may benefit from choosing a ratio that is several orders of magnitude higher. Fortunately, if a more accurate estimate is needed or desired, it may be calculated using known thermodynamic data, as described below.

A refined set of calculations for determining an appropriate minimum $pCOpCO_2$ ratio for an MTJ (e.g. a $CoFe/Al_2O_3/CoFe$ MTJ) follows. One main consideration regarding an alloy system, is that the activities of the individual atom types in the alloy are not unity. Therefore, if possible, every likely oxidation reaction should be calculated with respect to the elemental activity in the alloy. The proper $pCO:pCO_2$ ratio is then chosen to forbid the formation of the most stable ferromagnetic layer oxide while still providing significant driving force to oxidize the tunnel barrier layer. In accordance with the calculations outlined below (i.e., for Reactions II-VI) for the Co—Fe—Al system considered here, a $pCO:pCO_2$ ratio above 0.04 is needed to avoid oxidation of the ferromagnetic layer while it is practically impossible to avoid the oxidation of Al using a $pCO:pCO_2$ ratio at 25° C.

The minimum desirable $pCO:pCO_2$ ratio may be determined by calculating the minimum desirable $pCO:pCO_2$ ratio needed to forbid the formation of each possible ferromagnetic layer oxide. These calculations are outlined briefly for a CoFe ferromagnetic layer below.

Reaction II: $Fe+CO_2=FeO+CO$ @298 K

Energies of formation from pure elements at 298 K: $\Delta G°_{f,Fe}=0$ (by definition); $\Delta G°_{f,FeO}=2.456 \; E5$ J/mol; $\Delta G°_{f,CO2}=-3.946 \; E5$ J/mol; and $\Delta G°_{f,CO}=-1.379 \; E5$ J/mol. The equilibrium equation for Reaction II is:

$$\Delta G°_{rxn\,II} = \Delta G°_{f,CO} + \Delta G°_{f,FeO} - \Delta G°_{f,Fe} - \Delta G°_{f,CO2}; \text{ also}$$

$\Delta G°_{rxn\,II}=-RT\,\ln(K)=1.114\;E4$ J/mol, where R is the gas constant, T is temperature and K is the equilibrium constant which equals:

$$K = \exp\left(\frac{-\Delta G°_{rxn\,II}}{R\cdot T}\right) = \left(\frac{p_{CO} \cdot a_{FeO}}{p_{CO2} \cdot a_{Fe}}\right) = 1.118\;E\text{-}2,$$

where a represents activity. For gaseous species, activity is equal to partial pressure. Here, the iron is assumed to have a concentration of 10 at. % in Co. Thus, $$\frac{p_{CO}}{p_{CO_2}} = \frac{a_{Fe}}{a_{FeO}} K = 1.2 \; E\text{-}3$$

or higher to avoid oxidation of Fe.

Reaction III: $2Fe+3CO_2=Fe_2O_3+3CO$ @298 K

Energies of formation from pure elements at 298 K: $\Delta G°_{f,Fe}=0$ (by definition); $\Delta G°_{f,Fe2O3}=-2.093\;E6$ J/mol; $\Delta G°_{f,CO2}=-3.946\;E5$ J/mol; and $\Delta G°_{f,CO}=-1.379\;E5$ J/mol. The equilibrium equation for Reaction III is:

$$\Delta G°_{rxn\,III} = 3\Delta G°_{f,CO} + \Delta G°_{f,Fe2O3} - 2\Delta G°_{f,Fe} - 3\Delta G°_{f,CO2}; \text{ also}$$

$\Delta G°_{rxnIII}=-RT\,\ln(K)=2.637\;E4$ J/mol, where R is the gas constant, T is temperature and K is the equilibrium constant which equals:

$$K = \exp\left(\frac{-\Delta G°_{rxn\,III}}{R\cdot T}\right) = \left(\frac{p_{CO}^3 \cdot a_{Fe2O3}}{p_{CO2}^3 \cdot a_{Fe}^2}\right) = 2.397\;E\text{-}5,$$

where a represents activity. Here, the iron is assumed to have a concentration of 10 at. % in Co. Thus, $$\frac{p_{CO}}{p_{CO2}} = \left(\frac{a_{Fe}^2}{a_{Fe2O3}} K\right)^{1/3} = 6.2\;E\text{-}3$$

or higher to avoid oxidation of Fe.

Reaction IV: $3Fe+4CO_2=Fe_3O_4+4CO$ @298 K

Energies of formation from pure elements at 298 K: $\Delta G°_{f,Fe}=0$ (by definition); $\Delta G°_{f,Fe3O4}=-1.012\;E6$ J/mol; $\Delta G°_{f,CO2}=-3.946\;E5$ J/mol; and $\Delta G°_{f,CO}=-1.379\;E5$ J/mol. The equilibrium equation for Reaction IV is:

$$\Delta G°_{rxn\,IV} = 4\Delta G°_{f,CO} + \Delta G°_{f,Fe3O4} - 3\Delta G°_{f,Fe} - 4\Delta G°_{f,CO2}; \text{ also}$$

$\Delta G°_{rxn\,IV}=-RT\,\ln(K)=1.503\;E4$ J/mol, where R is the gas constant, T is temperature and K is the equilibrium constant which equals:

$$K = \exp\left(\frac{-\Delta G°_{rxn\,IV}}{R\cdot T}\right) = \left(\frac{p_{CO}^4 \cdot a_{Fe3O4}}{p_{CO2}^4 \cdot a_{Fe}^3}\right) = 2.328\;E\text{-}3,$$

where a represents activity. Here, the iron is assumed to have a concentration of 10 at. % in Co. Thus, $$\frac{p_{CO}}{p_{CO2}} = \left(\frac{a_{Fe}^3}{a_{Fe3O4}} K\right)^{1/4} = 3.9\;E\text{-}2$$

or higher to avoid oxidation of Fe.

Reaction V: $Co+CO_2=CoO+CO$ @298 K

Energies of formation from pure elements at 298 K: $\Delta G°_{f,Co}=0$ (by definition); $\Delta G°_{f,CoO}=-2.129\;E5$ J/mol; $\Delta G°_{f,CO2}=-3.946\;E5$ J/mol; and $\Delta G°_{f,CO}=-1.379\;E5$ J/mol. The equilibrium equation for Reaction V is:

$$\Delta G°_{rxn\,V} = \Delta G°_{f,CO} + \Delta G°_{f,CoO} - \Delta G°_{f,Co} - \Delta G°_{f,CO2}; \text{ also}$$

$\Delta G°_{rxn\,V}=-RT\,\ln(K)=4.376\;E4$ J/mol, where R is the gas constant, T is temperature and K is the equilibrium constant which equals:

$$K = \exp\left(\frac{-\Delta G°_{rxnV}}{R \cdot T}\right) = \left(\frac{\rho_{CO} \cdot a_{CoO}}{\rho_{CO2} \cdot a_{Co}}\right) = 2.153 \, E\text{-}8,$$

wherein a represents activity. Here, the Co is assumed to have a concentration of 90 at. % in Fe. Thus, $$\frac{\rho_{CO}}{\rho_{CO2}} = \frac{a_{Co}}{a_{CoO}} K = 1.9 \, E\text{-}8$$

or higher to avoid oxidation of Co.

Reaction VI: $3Co + 4CO_2 = Co_3O_4 + 4CO$ @298 K

Energies of formation from pure elements at 298 K: $\Delta G°_{f,Co}=0$ (by definition); $\Delta G°_{f,Co3O4}=-8.664 \, E5$ J/mol; $\Delta G°_{f,CO2}=-3.946 \, E5$ J/mol; and $\Delta G°_{f,CO}=-1.379 \, E5$ J/mol. The equilibrium equation for Reaction VI is:

$$\Delta G°_{rxn \, VI} = 4\Delta G°_{f,co} + \Delta G°_{f,Co3O4} - 3\Delta G°_{f,Co} - 4\Delta G°_{f,CO2};$$
also $\Delta G°_{rxn \, VI} = -RT \ln(K) = 1.604 \, E5$ J/mol, where R is the gas constant, T is temperature and K is the equilibrium constant which equals:

$$K = \exp\left(\frac{-\Delta G°_{rxnVI}}{R \cdot T}\right) = \left(\frac{\rho^4_{CO} \cdot a_{Co3O4}}{\rho^4_{CO2} \cdot a^3_{Co}}\right) = 7.841 \, E\text{-}29,$$

wherein a represents activity. Here, the Co is assumed to have a concentration of 90 at. % in Fe. Thus, $$\frac{\rho_{CO}}{\rho_{CO2}} = \left(\frac{a^3_{Co}}{a_{Co3O4}} K\right)^{1/4} = 8.695 \, E\text{-}8$$

or higher to avoid oxidation of Co.

It should be noted that these calculations and the Ellingham diagram (FIG. 2) do not provide information about reaction kinetics, only thermodynamic reaction stability. For example, Al and its alloys are generally considered to be oxidation resistant materials for structural applications even though the Ellingham diagram predicts a large driving force for oxidation under atmospheric conditions. The explanation for this apparent contradiction lies in the consideration of reaction kinetics. $Al_2O_3$ quickly forms on all exposed Al surfaces, but then abruptly stops. This happens because of the good lattice match between $Al_2O_3$ and Al; after the initial oxide forms, the only way for $O_2$ to reach the remaining Al is by diffusion, which is very slow at standard atmospheric conditions. Fortunately, for many TMR devices, the desired oxide layer thickness is on the order of 0.5 nm and the initial oxide formation may be enough to fully penetrate the layer. In addition, the reaction kinetics may be increased by oxidizing under elevated temperature and/or elevated pressure conditions, as illustrated in Example 1, below.

Exemplary embodiments of the present methods for the production of thermodynamically stable magnetic tunnel junctions are provided in the following examples. These examples are presented to illustrate the methods and assist one of ordinary skill in using the same. These examples are not intended in any way to otherwise limit the scope of the invention.

EXAMPLES

Example 1

Production of a CoFe/Aluminum Oxide/CoFe Magnetic Tunnel Junction Using a $CO/CO_2$ Oxidizing Gas This example illustrates a method for producing an MTJ composed of an aluminum oxide tunnel barrier layer sandwiched between two $Co_{0.9}Fe_{0.1}$ ferromagnetic layers. In this example, an Al layer and a CoFe layer were exposed separately to an oxidizing gas composed of a mixture of CO and $CO_2$ having a $pCO:pCO_2$ ratio of 0.1 in order to test for the oxidation. One advantage of this method is that the oxidation process was removed from the sputter deposition process. This allowed the total pressure of the $CO/CO_2$ oxidizing gas to become an independent parameter and eliminated the need to mix $CO/CO_2$ with Ar gas, as in a sputter plasma approach, and removed concerns about changes to the calculated reactivity due to a sputter plasma.

A CoFe ferromagnetic layer was deposited onto a Ti buffer layer having a thickness of approximately 100 nm using DC magnetron sputtering from a CoFe target in a high vacuum chamber. The Ti buffer layer was supported on a silicon substrate with a thin intervening silicon oxide layer. The ferromagnetic layer was then exposed to an oxidizing gas containing a $CO/CO_2$ mixture to verify that the ferromagnetic layer would not oxidize. In this experiment, the CoFe layer was deposited onto the underlying Ti substrate in a series of deposition steps. In each deposition step, a layer of CoFe was deposited using DC magnetron sputtering from a CoFe target. A CoFe layer having a thickness of approximately 9 nm was deposited initially. Next a second CoFe layer having a thickness of approximately 1 nim was deposited. The sputter plasma was then turned off and the deposited CoFe material was exposed to a gas containing a mixture of CO and $CO_2$ at a 1 minute flow of 0.25 mTorr. The $pCO:pCO_2$ ratio in the gas was about 0.1. The chamber was then evacuated and another 9 nm thick layer of CoFe was sputter deposited. For comparison, the procedure was repeated without exposing the CoFe material to the $CO/CO_2$ gas mixture between deposition cycles.

X-ray photoelectron spectroscopy (XPS) spectra were obtained for both CoFe samples. The spectra revealed no difference in the 0 signal observed in the middle layer of the CoFe samples in either sample, verifying that a $CO/CO_2$ ratio of 0.1 will not oxidize CoFe. Methods for obtaining XPS spectra from MTJ structures are described in Kottler et al., *J. Appl. Phys.*, 89, 3301-3306 (2001), the entire disclosure of which is incorporated herein by reference.

Another XPS experiment was used to verify that the $CO/CO_2$ oxidizing gas does not oxidize the CoFe. In this experiment, a first sample composed of a single 2 nm thick layer of CoFe was exposed to an oxidizing gas containing CO and $CO_2$ at a $pCO:pCO_2$ ratio of about 0.1. The ferromagnetic layer was exposed to the oxidizing gas at a pressure of 100 Torr for 20 minutes at 200° C. These elevated temperatures and pressures were used in order to speed up the reaction kinetics and decrease the time for oxidation. The CoFe layer was subsequently capped with a 4 nm layer of Al deposited onto its surface via magnetron sputter deposition from an Al target. The experiment was then repeated on a second CoFe sample without exposing the CoFe layer to the oxidizing gas prior to Al deposition. Finally, the experiment was repeated on a third CoFe sample where the oxidizing gas contained $O_2$ rather than a $CO/CO_2$ mixture. This time the CoFe was exposed to the oxidizing gas at a pressure of 20 mTorr for 20 minutes at 200° C. XPS experiments were then performed without depth profiling due to concerns of profiling technique smearing out composition data from thin layers. Changes in the Co-2p3 photoelectron peaks were used to determine the presence of oxygen in the resulting structures. The spectra showed no significant difference in the Co-2p3 peak collected from the CoFe layer that was not subjected to an oxidizing gas and the CoFe layer that was subjected to 100 Torr of $CO/CO_2$ for 20 min at 200° C. However, the CoFe layer that was subjected to just 20 mTorr of $O_2$ for 20 min at 200° C. showed significant change as the Co-2p3 peak broadened significantly due to partial oxidation.

After establishing that the CoFe layer does not oxidize upon exposure to the $CO/CO_2$ oxidizing gas, experiments were performed to demonstrate the effective oxidation of the Al under oxidizing conditions. In these experiments, a first sample composed of a 1 nm thick Al layer deposited on a 100 nm thick Ti buffer layer was exposed to an oxidizing gas containing CO and $CO_2$ at $apCO.pCO_2$ ratio of about 0.1. The Al layer was exposed to the oxidizing gas at a pressure of 100 Torr for 20 minutes at 200° C., then capped with 3 nm of Ti. A second sample composed of a 1 nm thick Al layer deposited on a Ti buffer layer was exposed to an oxidizing gas of $O_2$. This second Al layer was also exposed to the oxidizing gas at a pressure of 100 Torr for 20 minutes at 200° C., then capped with 3 nm of Ti.

The samples used for the above XPS experiments (and the FTIR experiments described below) were deposited with Ti buffer and cap layers rather than CoFe layers because thinner layers of Ti could be used to effectively protect the Al. (A pure Al sample capped with only 3 nm of Ti showed no traces of oxidation after exposure to air for several weeks.) This is important because the signal from the underlying Al layer must escape the capping layer in order to be detected by XPS and FTIR. A study on the early stages of Ti/Al reactions in thin-films is presented in Michaelsen et al., Mat. Res, Soc. Symp. Proc., 398, 245 (1998). Their calorimetry results show that onset temperatures for Ti/Al reactions are above 225° C. for all examined thicknesses, and about 275° C. for thicknesses comparable to those used in this analysis. This information was taken into consideration when designing experiments involving samples with Ti/Al interfaces. An underlying Ti buffer layer was used as it is more reflective than the Si substrate.

XPS experiments were performed on the resulting structures without depth profiling due to concerns of profiling technique smearing out composition data from thin layers. Changes in the Al-2s photoelectron peaks were used to determine the presence of aluminum oxide in the resulting structures. The Al layers subjected to the $CO/CO_2$ oxidizing gas showed oxidation of the Al. In fact, the Al-2s peak shift results for this system were similar to the Al-2s peak shift results observed for the Al layer oxidized in $O_2$.

The presence of the aluminum oxide was also confirmed using Fourier transform infrared spectroscopy (FTIR). The detection of thin Al-oxide layers with FTIR spectroscopy carried out using the methods described by Zhu et al., *Appl. Phys. Lett.*, 78, 3103 (2001), the entire disclosure of which is incorporated herein by reference. Briefly, two significant modifications to standard FTIR were required to obtain the sensitivity required to detect thin Al-oxide layers. First, the experiments had to be performed with a synchrotron radiation source in order to significantly increase the incident infrared radiation intensity. Second, a special grazing incidence setup (86°) was added to obtain more surface sensitivity. This experimental setup was duplicated with the addition of an 80° grazing incidence setup to the existing FTIR beamline at the University of Wisconsin Synchrotron Radiation Center.

The FTIR experiments detected the absorbance of infrared radiation. Al—O bonds are found to effectively absorb radiation at 960 $cm^{-1}$ wavenumber. The FTIR experiments were performed on the 1 nm thick Al layers capped with 3 nm of Ti. As before, a first sample composed of a 1 nm thick Al layer was exposed to an oxidizing gas containing CO and $CO_2$ at $apCO:pCO_2$ ratio of about 0.1. The Al layer was exposed to the oxidizing gas at a pressure of 100 Torr for 20 minutes at 200° C., then capped with 3 nm of Ti. A second sample composed of a 1 nm thick Al layer was exposed to an oxidizing gas of $O_2$. The Al layer was exposed to the oxidizing gas at a pressure of 100 Torr for 20 minutes at 200° C., then capped with 3 nm of Ti.

In the FTIR spectra, Ti—O peaks are located at wavenumbers in the upper 800's to the low 900's according to the FTIR study of Chertihin et al., *J. Phys. Chem.*, 99, 6356 (1995). To eliminate the potential for artifacts, a pure Al layer capped with Ti was chosen for background subtraction. Therefore, all of the observed peaks in the absorbance spectrum in this 800-1100 $cm^{-1}$ wavenumber regime were assumed to be due to Al oxidation reactions.

The results of FTIR experiments agreed with those obtained from the XPS experiments. Furthermore, the results were repeatable, as evidenced by a rescan of the $O_2$ oxidized sample weeks after the initial scan.

The location of the peak in the FTIR data gives some information about the oxide layer thickness. According to Zhu et. al., the location of the oxide peak decreases in wavenumber with oxide thickness. The observed peak locations were all roughly 925 $cm^{-1}$, which corresponds to an oxide layer thickness of roughly 5Å.

For MTJs having a thicker tunnel barrier layer, it may be advantageous to decrease the time for oxidation by increasing the oxidation temperature and pressure. For this reason, the experiment was repeated, however, this time the sample was oxidized at higher temperatures and pressures. As before, a sample composed of a 1 nrm thick Al layer deposited on a Ti buffer layer was exposed to an oxidizing gas containing CO and $CO_2$ at $apCO:pCO_2$ ratio of about 0.1. However, this time the Al layer was exposed to the oxidizing gas at a pressure of 500 Torr for 7 hours at 270° C., then capped with 3 nm of Ti. An FTIR analysis of the sample was conducted as described above and the peak shift data indicated that almost no metallic Al remained in the tunnel barrier layer. An FTIR analysis of a CoFe layer treated in an oxidizing gas of CO and $CO_2$ under the same conditions revealed no oxidation.

In another experiment, a sample composed of a 0.5 nm thick Al layer deposited on a Ti buffer layer was exposed to an oxidizing gas containing CO and $CO_2$ at a $pCO:pCO_2$ ratio of about 0.1. This time the Al layer was exposed to the oxidizing gas at a pressure of 500 Torr for 40 minutes at 230° C., then capped with 3 nm of Ti. An XPS analysis of the sample was conducted as described above and the data indicated that the Al layer had been completely oxidized. An XPS analysis of a CoFe layer treated in an oxidizing gas of CO and $CO_2$ under the same conditions revealed no oxidation.

Example 2

Production of a CoFe/Aluminum Oxide/CoFe Magnetic Tunnel Junction Using an $H_2O/H_2$ Oxidizing Gas This example illustrates a method for producing an MTJ composed of an aluminum oxide tunnel barrier layer sandwiched between two CoFe ferromagnetic layers. A pure Al layer was deposited onto a Ti buffer layer, as described in Example 1, using DC magnetron sputter deposition from an Al target. The resulting Al layer was subsequently oxidized in an $H_2O/H_2$ oxidizing gas.

In these experiments, a first sample composed of a 0.5 nm thick Al layer deposited on a Ti buffer layer was exposed to an oxidizing gas containing $H_2O$ and $H_2$ at a $pH_2O:pH_2$ ratio of about $2\times10^4$. The Al layer was exposed to the oxidizing gas at a pressure of 500 Torr for 20 minutes at 200° C., then capped with 3 nm of Ti. A second sample composed of a 0.5 nm thick Al layer deposited on a Ti buffer layer was exposed to an oxidizing gas of $O_2$. The Al layer was exposed to this oxidizing gas at a pressure of 0.02 Torr for 20 minutes at 25° C., then capped with 3 nm of Ti.

An XPS analysis of the sample was conducted as described above and the data indicated that the Al layer had been completely oxidized. An XPS analysis of a CoFe layer treated in an oxidizing gas of $H_2O$ and $H_2$ under the same conditions revealed no oxidation. In contrast, an XPS analysis of the CoFe layer treated in an oxidizing gas of $O_2$ at a pressure of 0.02 Torr for 20 minutes at 25° C. showed significant oxidation.

Example 3

Production of a CoFe/Yttrium Oxide/CoFe Magnetic Tunnel Junction Using an $H_2O/H_2$ Oxidizing Gas This example illustrates a method for producing an MTJ composed of a yttrium oxide tunnel barrier layer sandwiched between two CoFe ferromagnetic layers. A pure Y layer was deposited onto a Ti buffer layer using DC magnetron sputter deposition from a Y target. The resulting Y layer was subsequently oxidized in an $H_2O/H_2$ oxidizing gas.

In these experiments, a first sample composed of a 1 nm thick Y layer deposited on a Ti buffer layer was exposed to an oxidizing gas containing $H_2O$ and $H_2$ at a $pH_2O:pH_2$ ratio of about $2\times10^{-4}$. The Y layer was exposed to the oxidizing gas at a pressure of 1 Torr for 20 minutes at room temperature, then capped with 3 nm of Ti.

An XPS analysis of the sample was conducted as described above and the data indicated that the Y layer had been completely oxidized. An XPS analysis of a CoFe layer treated in an oxidizing gas of $H_2O$ and $H_2$ under the same conditions revealed no oxidation.

Example 4

Production of a CoFe/Tantalum Oxide/CoFe Magnetic Tunnel Junction Using an $H_2O/H_2$ Oxidizing Gas This example illustrates a method for producing an MTJ composed of a tantalum oxide tunnel barrier layer sandwiched between two CoFe ferromagnetic layers. A pure Ta layer was deposited onto a CoFe layer using DC magnetron sputter deposition from a Ta target. The resulting Ta layer was subsequently oxidized in an $H_2O/H_2$ oxidizing gas.

In these experiments, a first sample composed of a 0.5 nm thick Ta layer deposited on a Ti buffer layer was exposed to an oxidizing gas containing $H_2O$ and $H_2$ at a $pH_2O:pH_2$ ratio of about $2\times10^{-4}$. The Ta layer was exposed to the oxidizing gas at a pressure of 500 Torr for 60 minutes at 490° C., then capped with 3 nm of Ti.

An XPS analysis of the sample was conducted as described above and the data indicated that the Ta layer had been completely oxidized. An XPS analysis of a CoFe layer treated in an oxidizing gas of $H_2O$ and $H_2$ under the same conditions revealed no oxidation.

The invention has been described with reference to specific and illustrative embodiments. However, it should be understood that many variations and modifications may be made while remaining within the scope of the following claims.

What is claimed is:

1. A method for making a magnetic tunnel junction comprising a layer of metal oxide or semiconductor oxide on a first ferromagnetic layer, the method comprising:
   (a) selecting a temperature and an $O_2$ partial pressure at which the oxidation of the metal or semiconductor is thermodynamically favored while the oxidation of the first ferromagnetic layer is not; and
   (b) exposing a layer of the metal or the semiconductor deposited on the first ferromagnetic layer to a gas comprising a mixture of $CO_2$ and CO or a mixture of $H_2$ and $H_2O$ to oxidize the metal or semiconductor and provide a tunnel barrier oxide layer on the first ferromagnetic layer;

wherein $(pCO/pCO_2)$ or $(pH_2/pH_2O) \geq (1/(pO_2 \ast K))^{1/2}$, where pCO is the partial pressure of CO in the gas mixture; $pCO_2$ is the partial pressure of $CO_2$ in the gas mixture; $pH_2$ is the partial pressure of $H_2$ in the gas mixture; $pH_2O$ is the partial pressure of $H_2O$ in the gas mixture; $pO_2$ is the selected $O_2$ partial pressure; and K is an equilibrium constant calculated from $\exp(-\Delta G°_{rxn}/R\ast T)$, where R is the gas constant, T is the selected temperature, and $-\Delta G°_{rxn}$ is the free energy of formation of $CO_2$ from CO and $O_2$ or the free energy of formation of $H_2O$ from $H_2$ and $O_2$;

further wherein the selected $O_2$ partial pressure is no greater than $10^{-20}$ torr, and the free energy for the production of an oxide in the metal or semiconductor is less than the free energy for the production of an oxide in the ferromagnetic layer at the selected temperature and $O_2$ partial pressure;

and further wherein the first ferromaanetic layer comprises a Co—Fe alloy or a Ni—Fe alloy.

2. The method of claim 1, further comprising depositing a second ferromagnetic layer over the tunnel barrier oxide layer.

3. The method of claim 1 wherein the first ferromagnetic layer comprises a Co—Fe alloy.

4. The method of claim 1 wherein the first ferromagnetic layer comprises a Ni—Fe alloy.

5. The method of claim 1 wherein a layer of a semiconductor is deposited onto the first ferromagnetic layer.

6. The method of claim 1 wherein a layer of a metal or metal alloy is deposited onto the first ferromagnetic layer.

7. The method of claim 6 wherein the metal is selected from the group consisting of aluminum, chromium, manganese, silicon, titanium, magnesium, calcium, hafnium, zirconium, gallium and niobium.

8. The method of claim 6 wherein the metal is aluminum.

9. The method of claim 6 wherein the metal is yttrium or tantalum.

10. The method of claim 3 wherein the oxidizing gas comprises a mixture of CO and $CO_2$ and the ratio of CO partial pressure to $CO_2$ partial pressure in the gas mixture is at least about 0.1.

11. The method of claim 1 wherein the total pressure of $CO_2$ and CO in the gas mixture is at least about 100 Torr and the gas temperature is at least about 200° C.

12. The method of claim 8 wherein the total pressure of $CO_2$ and CO in the gas mixture is about 100 to 500 Torr and the gas temperature is about 200° C. to 500° C.

13. The method of claim 3 wherein the oxidizing gas comprises a mixture of $H_2$ and $H_2O$ and the ratio of $H_2O$ partial pressure to $H_2$ partial pressure in the gas mixture is at least about 0.0002.

14. The method of claim 1 wherein the total pressure of $H_2$ and $H_2O$ in the gas mixture is at least about 100 Torr and the gas temperature is at least about 200° C.

15. The method of claim 8 wherein the total pressure of $H_2$ and $H_2O$ in the gas mixture is about 100 to 500 Torr and the gas temperature is about 200° C. to 500° C.

16. The method of claim 1 wherein the tunnel barrier oxide layer has a thickness of no more than about 10 nm.

17. The method of claim 1 wherein the tunnel barrier oxide layer has a thickness of no more than about 2 nm.

18. The method of claim 17 wherein the first ferromagnetic layer has a thickness of no more than about 10 nm.

19. The method of claim 1 further comprising depositing the first ferromagnetic layer on an antiferromagnetic layer.

20. The method of claim 1, wherein the first ferromagnetic layer is not oxidized during the step of exposing the layer of the metal or the semiconductor to a gas comprising a mixture of $CO_2$ and CO or a mixture of $H_2$ and $H_2O$.

21. The method of claim 1, wherein the first ferromagnetic layer comprises a Co—Fe alloy, and further wherein a layer of metal is deposited onto the first ferromagnetic layer and the metal is aluminum, yttrium, or tantalum.

22. The method of claim 1, wherein the first ferromagnetic layer comprises a Co—Fe alloy and the oxidizing gas comprises a mixture of $H_2$ and $H_2O$ and the ratio of $H_2O$ partial pressure to H2 partial pressure in the gas mixture is at least about 0.0002, and further wherein a layer of metal is deposited onto the first ferromagnetic layer and the metal is aluminum, yttrium, or tantalum.

23. The method of claim 1, wherein the first ferromagnetic layer comprises a Co—Fe alloy and the oxidizing gas comprises a mixture of CO and $CO_2$ and the ratio of CO partial pressure to $CO_2$ partial pressure in the gas mixture is at least about 0.1, and further wherein a layer of metal is deposited onto the first ferromagnetic layer and the metal is aluminum.

24. The method of claim 1, wherein the selected $O_2$ partial pressure is no greater than $10^{-80}$ torr.

25. A method for making a magnetic tunnel junction comprising a layer of metal oxide or semiconductor oxide on a first ferromagnetic layer, the method comprising:
(a) selecting a temperature and an $O_2$ partial pressure at which the oxidation of the metal or semiconductor is thermodynamically favored while the oxidation of the first ferromagnetic layer is not; and
(b) exposing a layer of the metal or the semiconductor deposited on the first ferromaanetic layer to a gas comprising a mixture of $CO_2$ and CO or a mixture of $H_2$ and $H_2O$ to oxidize the metal or semiconductor and provide a tunnel barrier oxide layer on the first ferromagnetic layer;
wherein $(pCO/pCO_2)$ or $(pH_2/pH_2O) \leqq (1/(pO_2*K))^{1/2}$,
where pCO is the partial pressure of CO in the gas mixture; $pCO_2$, is the partial pressure of $CO_2$ in the gas mixture; $pH_2$ is the partial pressure of $H_2$ in the gas mixture; $pH_2O$ is the partial pressure of $H_2O$ in the gas mixture; $pO_2$ is the selected $O_2$ partial pressure; and K is an equilibrium constant calculated from $\exp(-\Delta G°_{rxn}/R*T)$, where R is the gas constant, T is the selected temperature, and $-\Delta G°_{rxn}$ is the free en of formation of $CO_2$ from CO and $O_2$ or the free energy of formation of $H_2O$ from $H_2$ and $O_2$;
further wherein the selected $O_2$ partial pressure is no greater than $10^{-20}$ torr, and the free energy for the production of an oxide in the metal or semiconductor is less than the free energy for the production of an oxide in the ferromagnetic layer at the selected temperature and $O_2$ partial pressure;
and further wherein the first ferromagnetic layer is selected from the group consisting of Co, Fe, Ni, a Co—Fe alloy, and a Ni—Fe alloy, a layer of metal is deposited onto the first ferromagnetic layer, and the metal is selected from the group consisting of Cr, Mn, Si, Al, Mg, Ca, Y, and Ta.

26. A method for making a magnetic tunnel junction comprising a layer of metal oxide or semiconductor oxide on a first ferromagnetic layer, the method comprising:
(a) selecting a temperature and an $O_2$ partial pressure at which the oxidation of the metal or semiconductor is thermodynamically favored while the oxidation of the first ferromagnetic layer is not; and
(b) exposing a layer of the metal or the semiconductor deposited on the first ferromagnetic layer to a gas comprising a mixture of $CO_2$ and CO or a mixture of $H_2$ and $H_2O$ to oxidize the metal or semiconductor and provide a tunnel barrier oxide layer on the first ferromagnetic layer;
wherein $(pCO/pCO_2)$ or $(pH_2/pH_2O) \geqq (1/(pO_2*K))^{1/2}$,
where pCO is the partial pressure of CO in the gas mixture; $pCO_2$ is the partial pressure of $CO_2$ in the gas mixture; $pH_2$ is the partial pressure of $H_2$ in the gas mixture; $pH_2O$ is the partial pressure of $H_2O$ in the gas mixture; $pO_2$ is the selected $O_2$ partial pressure; and K is an equilibrium constant calculated from $\exp(-\Delta G°_{rxn}/R*T)$, where R is the gas constant, T is the selected temperature, and $-\Delta G°_{rxn}$ is the free energy of formation of $CO_2$ from CO and $O_2$ or the free energy of formation of $H_2O$ from $H_2$ and $O_2$;
further wherein the selected $O_2$ partial pressure is no greater than $10^{-20}$ torr, and the free energy for the production of an oxide in the metal or semiconductor is less than the free energy for the production of an oxide in the ferromagnetic layer at the selected temperature and $O_2$ partial pressure;
and further wherein a layer of a metal or metal alloy is deposited onto the first ferromagnetic layer and the metal is selected from the group consisting of aluminum, chromium, manganese, silicon, titanium, magnesium, calcium, hafuium, zirconium, gallium, and niobium.

27. The method of claim 26, wherein the metal is aluminum.

28. A method for making a magnetic tunnel junction comprising a layer of metal oxide or semiconductor oxide on a first ferromagnetic layer, the method comprising:
(a) selecting a temperature and an $O_2$ partial pressure at which the oxidation of the metal or semiconductor is thermodynamically favored while the oxidation of the first ferromagnetic layer is not; and
(b) exposing a layer of the metal or the semiconductor deposited on the first ferromagnetic layer to a gas comprising a mixture of $CO_2$ and CO or a mixture of $H_2$ and H$_2$O to oxidize the metal or semiconductor and provide a tunnel barrier oxide layer on the first ferromagnetic layer;

wherein (pCO/pCO$_2$) or (pH$_2$/pH$_2$O)$\geq$(1/(pO$_2$*K))$^{1/2}$, where pCO is the partial pressure of CO in the gas mixture; pCO$_2$ is the partial pressure of CO$_2$ in the gas mixture; pH$_2$ is the partial pressure of H$_2$ in the gas mixture; pH$_2$O is the partial pressure of H$_2$O in the gas mixture; pO$_2$ is the selected O$_2$ partial pressure; and K is an equilibrium constant calculated from exp($-\Delta G°_{rxn}$/R*T), where R is the gas constant, T is the selected temperature, and $-\Delta G°_{rxn}$ is the free energy of formation of CO$_2$ from CO and O$_2$ or the free energy of formation of H$_2$O from H$_2$ and O$_2$;

further wherein the selected O$_2$ partial pressure is no greater than 10$^{-20}$ torr, and the free energy for the production of an oxide in the metal or semiconductor is less than the free energy for the production of an oxide in the ferromagnetic layer at the selected temperature and O$_2$ partial pressure;

and further wherein a layer of a metal or metal alloy is deposited onto the first ferromagnetic layer and the metal is yttrium or tantalum.

\* \* \* \* \*

UNITED STATES PATENT AND TRADEMARK OFFICE
CERTIFICATE OF CORRECTION

PATENT NO.       : 7,579,042 B2
APPLICATION NO.  : 10/902281
DATED            : August 25, 2009
INVENTOR(S)      : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 514 days.

Signed and Sealed this

Fourteenth Day of September, 2010

David J. Kappos
*Director of the United States Patent and Trademark Office*